(12) United States Patent
Wu (10) Patent No.: US 8,976,048 B2
(45) Date of Patent: Mar. 10, 2015

(54) EFFICIENT PROCESSING OF HUFFMAN ENCODED DATA

(71) Applicant: Advanced Micro Devices, Inc., Sunnyvale, CA (US)

(72) Inventor: Winthrop J. Wu, Shrewsbury, MA (US)

(73) Assignee: Adavanced Micro Devices, Inc., Sunnyvale, CA (US)

( * ) Notice: Subject to any disclaimer, the term of this patent is extended or adjusted under 35 U.S.C. 154(b) by 113 days.

(21) Appl. No.: 13/895,109

(22) Filed: May 15, 2013

(65) Prior Publication Data

US 2014/0340246 A1    Nov. 20, 2014

(51) Int. Cl.
*H03M 7/40*    (2006.01)
*H04N 19/102*  (2014.01)
*H04N 19/61*   (2014.01)
*H03M 7/30*    (2006.01)

(52) U.S. Cl.
CPC .............. *H03M 7/40* (2013.01); *H04N 7/26106* (2013.01); *H04N 7/50* (2013.01); *H03M 7/30* (2013.01)

USPC .................................................. 341/65; 341/67

(58) Field of Classification Search
CPC ............ H03M 7/40; H03M 7/30; H04N 7/50; H04N 7/26106
USPC .............. 341/65, 67, 51; 375/240.23, 240.03; 382/246, 232
See application file for complete search history.

(56) References Cited

U.S. PATENT DOCUMENTS 7,148,820 B2 * 12/2006 Sakai et al. .................. 341/67

* cited by examiner

*Primary Examiner* — Joseph Lauture
(74) *Attorney, Agent, or Firm* — Liang & Cheng, PC (57) ABSTRACT

A method of decoding Huffman-encoded data may comprise receiving a symbol associated with the Huffman encoded data, selecting a target group for the symbol based on a bit length value associated with the symbol, associating the symbol with the target group, associating the symbol with a code, and incrementing a starting code for each of a plurality of groups associated with a starting code that is equal to or greater than the starting code of the target group.

20 Claims, 8 Drawing Sheets

FIGURE 8

EFFICIENT PROCESSING OF HUFFMAN ENCODED DATA

TECHNICAL FIELD

This disclosure relates to the field of compression and, in particular, to processing of Huffman encoded data.

BACKGROUND

Modern computing applications frequently benefit from the use of lossless data compression, which is a class of data compression wherein the exact original data may be restored from the compressed form of the data without any loss of information. Lossless data compression may be used, for example, to compress databases files, documents, executable files, or other types of files where even minor differences between the original data and the decompressed data may not be tolerated.

One technique for performing lossless data compression is known as Huffman encoding, a process wherein symbols may be encoded into variable length bit strings based on the actual or estimated frequency of occurrence of those symbols in the original data. Each symbol in a Huffman encoding scheme may represent, for example, a single character. The more frequently occurring symbols are assigned to shorter bit strings, while less frequently occurring symbols are assigned to longer bit strings. Huffman encoding uses "prefix-free codes", where the bit string for any given symbol is never a prefix for the bit string of any other symbol.

In order for a computer system to decode a set of Huffman encoded data, the computer system may construct a tree structure, then use the sequence of bits of the encoded data to traverse the tree structure in order to correlate each of the prefix-free codes in the encoded data with the appropriate symbol.

BRIEF DESCRIPTION OF THE DRAWINGS

The present disclosure is illustrated by way of example, and not by way of limitation, in the figures of the accompanying drawings.

FIGS. 3A-7A illustrate stages during a process of adding symbols to a decoding table, according to one embodiment.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the spirit and scope of the embodiments.

In one embodiment, a file containing encoded data may include instructions or data for recreating a data structure to be used for decoding the encoded data in the file. For example, a Huffman encoded file may include symbol-length pairs that can be used to reconstruct a tree data structure, and this tree may then be used to decode the encoded data in the file.

Figure 1:
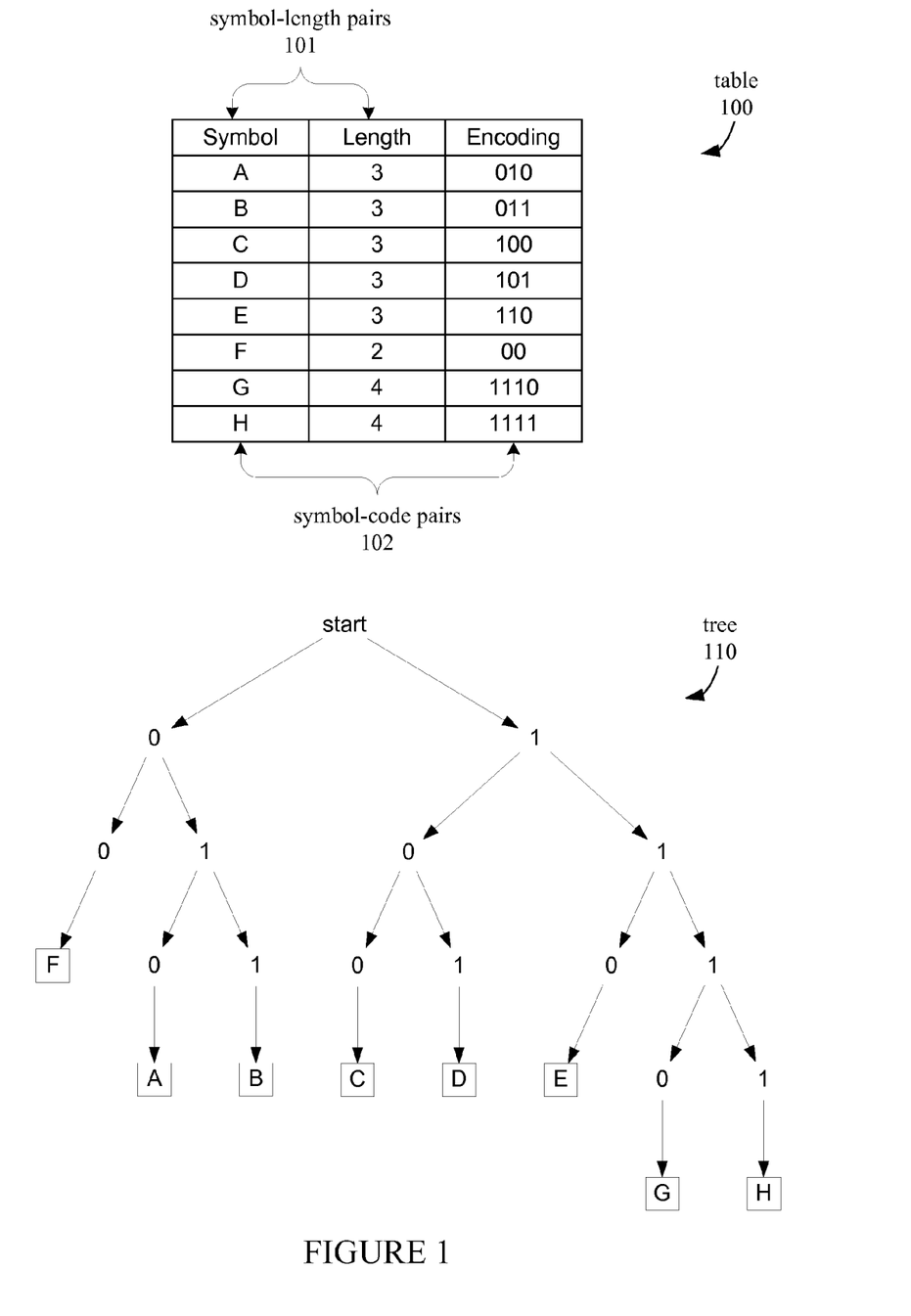
FIG. 1 illustrates a set of Huffman symbols and a corresponding Huffman tree, according to an embodiment.

FIG. 1 illustrates a table 100 and a Huffman tree 110, according to one embodiment. Table 100 contains a set of symbol-length pairs 101, where each of the symbol-length pairs 101 associates one of the symbols A-H with a bit length value. For example, symbol A is associated with length 3. The symbols A-H are also each associated with a code to form a set of symbol-code pairs; for example, symbol A is associated with the code '010'.

In one embodiment, the relationships in table 100 may be represented as a tree 100 that may be used by a decoding process to convert encoded data into the original decoded symbols. In one embodiment, each sequential bit in the encoded data may be used to traverse the tree 110 until a symbol is reached. For example, a bit sequence of '100' would cause the tree 110 to be traversed from the 'start' node to the right branch leading to '1', then via a left branch to '0', another left branch to '0', and finally to the decoded symbol 'C'. After a decoded symbol is reached, the next following bit in the encoded data would begin the traversal of tree 110 again from the start node.

In one embodiment, a decoding table data structure for decoding encoded data may be created instead of a tree structure such as tree 110, where the size of the decoding table corresponds to the size of the encoded symbol alphabet and does not use redundant storage that may be used in other implementations. In one embodiment, such a decoding table may be recreated from a single pass through the Huffman encoded alphabet, and may allow a Huffman encoded symbol to be decoded with a single access to the table structure, rather than multiple accesses.

Figure 2:
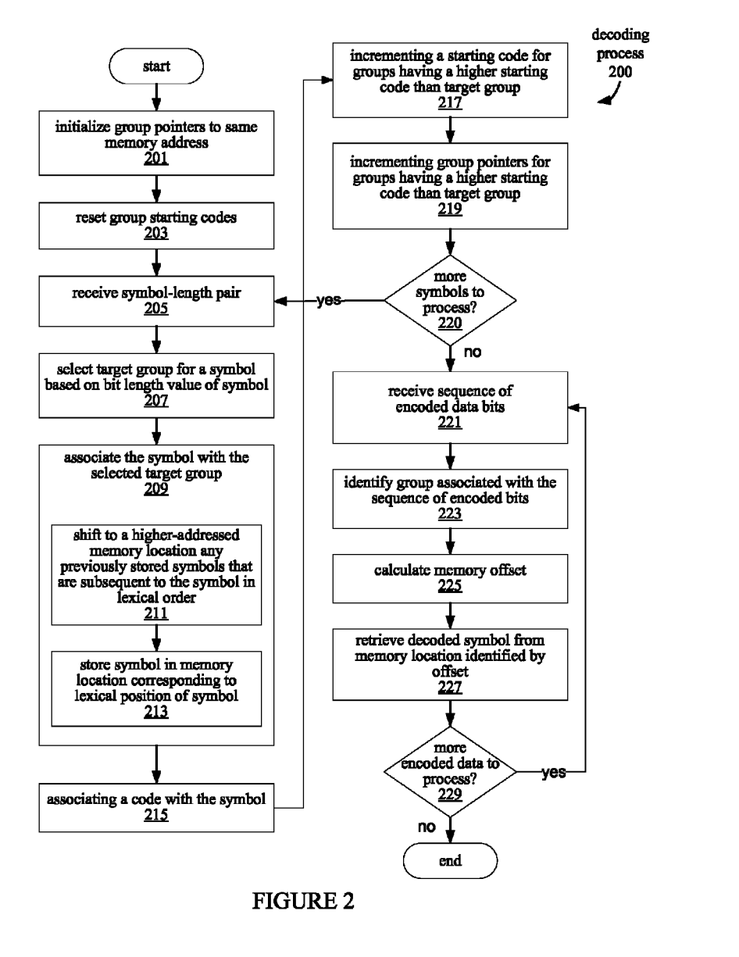
FIG. 2 is a flow diagram illustrating a process of decoding encoded data, according to one embodiment.

FIG. 2 illustrates a process 200 for decoding encoded data, such as Huffman encoded data, according to one embodiment. In one embodiment, the decoding process 200 may be implemented using a computer system having a processor and memory. In one embodiment, the process 200 may be implemented using an arrangement of logic gates, registers, and/or other devices. Process 200 begins at block 201.

At block 201, the process 200 may begin by creating a decoding table data structure that includes a number of groups. In one embodiment, each of these groups may correspond to a different symbol length. Each group may also have its own different pointer, and the process 200 may further initialize each of the group pointers to the same memory address. For example, for each group of a set of N groups, the process 200 may set all of the N group pointers to a memory address associated with the beginning of the decoding table. In one embodiment, this represents an empty table containing no symbols. From block 201, the process 200 may continue at block 203.

In one embodiment, each of the groups in the decoding table may be associated with a group starting code. At block 203, the process 200 may reset each of these group starting codes to the same value. For example, the process 200 may initialize the group starting codes for each of the N groups to '0'. From block 203, the process 200 continues at block 205.

At block 205, the process 200 may receive a new symbol associated with the Huffman encoded data. In one embodiment, the new symbol may be one of a plurality of symbols received in a stream of symbols associated with the encoded data. In one embodiment, the symbol may be received as part of a symbol-length pair, which comprises the symbol and an associated bit length value. In one embodiment, the set of symbol-length pairs may be read from a data file that includes Huffman encoded data that may be decoded based on the symbol-length pairs. From block 205, the process 200 continues at block 207.

At block 207, the process 200 may select a target group based on the bit length value of the symbol-length pair. In one embodiment, the decoding table may include a number of groups each associated with a bit length value or a range of bit length values. In one embodiment, each of the bit length values associated with a group is associated with only one group. Thus, the process at block 207 may select one of the groups as the target group for a particular symbol-length pair by matching the bit length value of the symbol-length pair with the bit length value or range of bit length values associated with the target group. From block 207, the process 200 may continue at block 209.

At block 209, the process 200 may associate the symbol from the symbol-length pair into the target group selected at block 207. In one embodiment, the process 200 may associate the symbol with the target group by storing the symbol in a memory space corresponding to the target group. For example, where each of the groups in the decoding table may be associated with a different non-overlapping range of memory addresses, the process 200 may associate the symbol with the target group by storing the symbol in a memory location within the range of memory addresses corresponding to the target group.

In one embodiment, the symbol may be stored in the memory space according to a predetermined lexical order of symbols. In one embodiment, the predetermined lexical order may be alphabetical order, may be an ordering of symbols as defined by a character set such as American Standard Code for Information Interchange (ASCII), or may be some other ordering that is determined prior to the execution of block 209.

In one embodiment, the process 200 may identify a position for storing the new symbol that preserves the lexical ordering of the new symbol among the symbols already stored in the memory space corresponding to the target group. For example, the process 200 may store the new symbol at a memory address that is higher than the memory addresses of previously stored symbols that occur earlier than the new symbol in the lexical ordering. The process 200 may store the new symbol at a memory address that is lower than the memory addresses of previously stored symbols that occur later than the new symbol in the lexical ordering. Accordingly, the symbols may be stored in the memory space in the predetermined lexical order with respect to the memory addresses, regardless of the sequential order in which they are received.

In one embodiment, a process 209 for storing the symbol in a memory space associated with the target group in order to associate the symbol with the target group may further include the operations represented by blocks 211 and 213. At block 211, each of the previously stored symbols in the target group's memory space that is subsequent to the new symbol according to the predetermined lexical order may be shifted to a higher addressed memory location in order to make room for the new symbol to be inserted in lexical order.

At block 213, the new symbol may be inserted at the memory location made available in block 211. In one embodiment, this memory location corresponds to the correct position of the symbol in the predetermined lexical order among the symbols already stored in the memory space associated with the target group. From block 209, the process 200 continues at block 215.

At block 215, the process 200 may associate a code with the newly added symbol. In one embodiment, the code may be a sequence of bits and may include a number of bits indicated by the bit length value (from the symbol-length pair) associated with the newly added symbol. The symbol and its associated code thus constitute a symbol-code pair. In one embodiment, the process 200 may associate the code with the symbol by storing the code at a memory location associated with the symbol. For example, the code may be stored at a memory location adjacent to the memory location of the symbol, or may be stored at the same offset relative to different respective memory base addresses for storing symbols and their codes. In alternative embodiments, the code may not be explicitly stored in memory, but may be implicitly associated with a symbol based on the memory location at which the symbol is stored. From block 215, the process 200 continues at block 217.

In one embodiment, each of the groups, including the target group, may be associated with a starting code that may or may not be the same as the starting code for another one of the groups. At block 217, the process 200 may increment the starting code for groups having an equal or higher starting code than the target group. In one embodiment, the starting code for each group having an equal or higher starting code may be incremented by adding $2^{(j-i)}$ to the starting code, where j represents a bit length value associated with the group and where i represents the bit length value of the symbol. From block 217, the process 200 continues at block 219.

At block 219, the process 200 may increment the group pointer of each of the groups associated with a starting code that is equal to or greater than the starting code of the target group. In one embodiment, these group pointers may be incremented by an amount corresponding to the amount of memory occupied by the newly stored symbol-code pair. For example, if the symbol-code pair occupies one memory block, the group pointer addresses to be incremented may be incremented by one. From block 219, the process 200 continues at block 220.

At block 220, the process 200 may determine whether all of the symbols, or symbol-length pairs, have been processed. If more symbols remain to be processed, the process continues back to block 205, where the next symbol or symbol-length pair may be received. Thus, in one embodiment, the blocks 205-220 repeat until all of the symbols have been added to the decoding table and have been associated with a code. At block 220, when all of the symbols have been processed, the process 200 continues at block 221.

At block 221, the process 200 may receive a sequence of encoded data bits. In one embodiment, the encoded data bits may be Huffman encoded data bits from the same data file containing the symbol-length pairs and the encoded data. In one embodiment, the decoding table regenerated from the symbol-length pairs as described in connection with blocks 201-220 may be used to decode the encoded data, including the data bits received at block 221. In one embodiment, each conversion of a code comprising the received data bits into its corresponding symbol may be completed using a single access into the decoding table. By the operations of blocks 221-227, the process 200 may generate decoded data based on the Huffman encoded data and on the symbol-code pairs in the decoding table.

At block 223, the process 200 may identify a group associated with the sequence of encoded bits received at block 221. In one embodiment, this may be accomplished by comparing the sequence of encoded bits with the starting codes for at least one of the groups. In one embodiment, the selected group has a starting symbol that is less than or equal to the sequence of encoded bits, while the sequence of encoded bits is less than the next highest starting code.

For example, the received sequence of encoded bits may be compared against each of the group starting codes, starting from the group having the lowest starting code, until the sequence of encoded bits is less than the starting code. In this case, the last group that is found to have a starting code less than or equal to the sequence of encoded bits may accordingly be identified as the group associated with the sequence of encoded bits. From block 223, the process 200 continues at block 225.

At block 225, the process 200 may calculate a memory offset based on the sequence of encoded bits and the starting code for the group identified at block 223. In one embodiment, the memory offset may be calculated by subtracting the sequence of encoded bits from the starting code of the identified group. The resulting difference represents the memory offset. From block 225, the process 200 continues at block 227.

At block 227, the process 200 may retrieve a decoded symbol from a memory location identified by the offset. In one embodiment, the group pointer of the group identified at block 225 may be used as a base address; the offset may be added to this pointer address to identify a memory location where the decoded symbol may be found. The decoded symbol may then be retrieved from this memory location and output to an output data stream or file. From block 227, the process 200 continues at block 229.

At block 229, the process 200 determines whether there is more encoded data to process. For example, the process 200 may determine whether the end of the encoded data file has been reached. If all of the encoded data has not yet been processed, the process 200 may continue back to block 221, where the next sequence of encoded data bits may be received. Thus, in one embodiment, the blocks 221-229 may be repeated to decode all of the available encoded data. At block 229, if there is no more encoded data to decode, the process 200 ends.

Figure 3A:
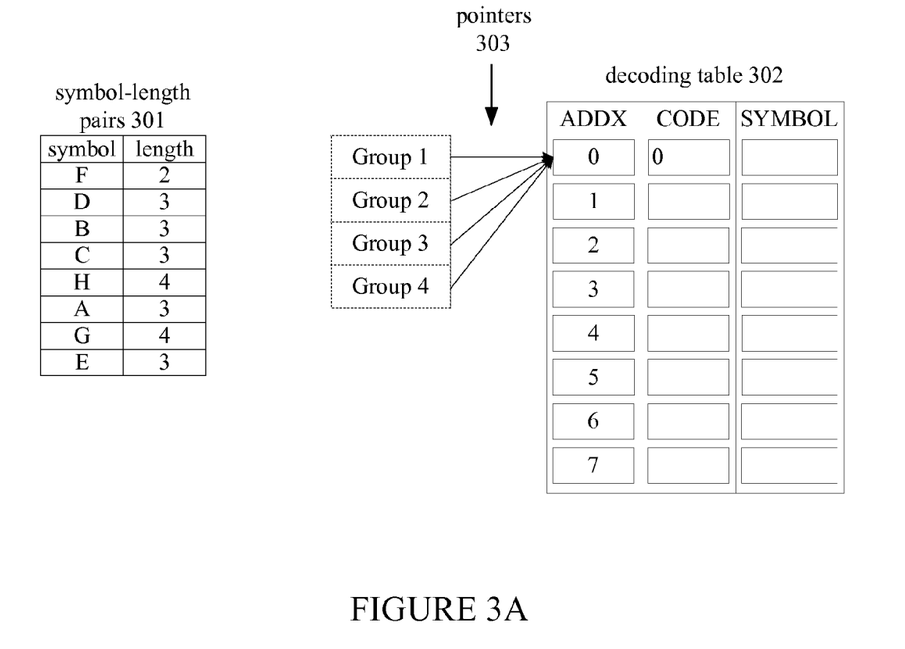

FIGS. 3A-7A illustrate the progress of a decoding table 302 as a set of predetermined symbol-length pairs 301 is added to a decoding table 302, according to an embodiment. In one embodiment, the process of adding the symbol-length pairs 301 to the decoding table 302 may correspond to blocks 201-220 in decoding process 200. The process 200 may begin with a decoding table 302 and a set of group data structures (Group 1, Group 2, Group 3, and Group 4), as illustrated in FIG. 3A. In one embodiment, each of the address locations in the decoding table 302 may associate a code (CODE) with a symbol (SYMBOL). Each of the group data structures may be associated with one of a set of pointers 303 that points to an address (ADDX) in the decoding table 302. In one embodiment, before any of the symbol-length pairs 301 have been processed, each of the pointers 303 may be initialized to point to the same address, as provided at block 201 of process 200. These group pointers 303 indicate the starting addresses of their respective groups in the decoding table 302. In one embodiment, the starting code for each of the Groups 1-4 may be initialized to the same code '0', in accord with block 203 of process 200. In one embodiment, the starting code for a particular group may be represented by the first N bits of the starting code value stored in the table 302, where N is the bit length value associated with the particular group. For example, the same value '0000' stored in memory may represent a starting code of '0' for Group 1, '00' for Group 2, '000' for Group 3, and '0000' for Group 4.

Figure 3B:
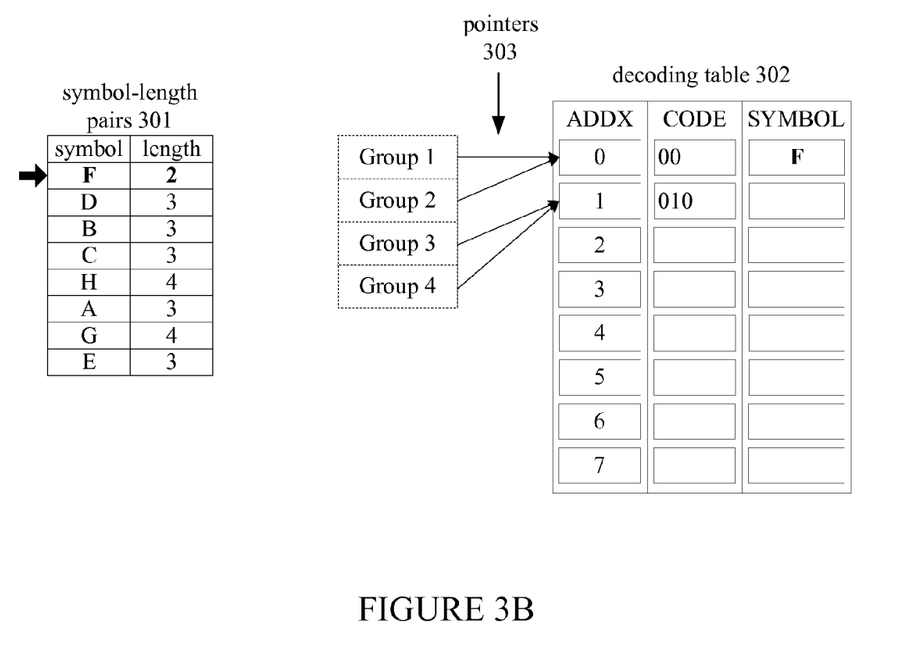

In one embodiment, the symbol-length pairs 301 may be added in order as illustrated in FIG. 3A, for example; thus, the symbol-length pair (F, 2) would be added first, followed by (D, 3), (B, 3), and so on. In FIG. 3B, the first symbol-length pair (F, 2) may be received, as provided at block 205, and a target group selected into which the symbol 'F' can be added. In one embodiment, Groups 1, 2, 3, and 4 are associated with bit length values 1, 2, 3, and 4, respectively; thus, Group 2 is selected as the target group because 'F' is associated with a bit length value of '2' in the symbol-length pair (F, 2). Symbol 'F' may then be stored in the memory location at address '0', since the pointer for Group 2 indicates address '0' as the start of the Group 2 entries. The newly added symbol 'F' is the first symbol to be added to Group 2. Thus 'F' is associated with code '00', which is the existing starting code for Group 2.

In one embodiment, the starting codes for Groups 3 and 4 may be incremented, since these starting codes are equal to or greater than the starting code of the target Group 2. The incrementing of the starting codes for Groups 3 and 4 may correspond to block 217 of process 200. The pointers for these same groups, Groups 3 and 4, may also be incremented. This incrementing of the group pointers may correspond to block 219 of process 200. In one embodiment, the pointers for Groups 3 and 4 are each incremented by 1, to point to address '1'. The newly incremented starting codes may be stored at the memory location referenced by the newly incremented group pointers.

In one embodiment, each starting code may be incremented by adding $2^{(j-i)}$ to the starting code, wherein i represents the bit length value of the symbol and j represents the bit length value associated with the group; thus, the starting code for Group 3 is incremented from '000' to '010', and the starting code for Group 4 is incremented from '0000' to '0100'. As illustrated in FIG. 3B, both of these starting codes may be represented by the same value in memory. As previously explained, the value '0100' may represent a starting code of '0100' for Group 4, while representing a starting code of '010' for Group 3.

Figure 4A:
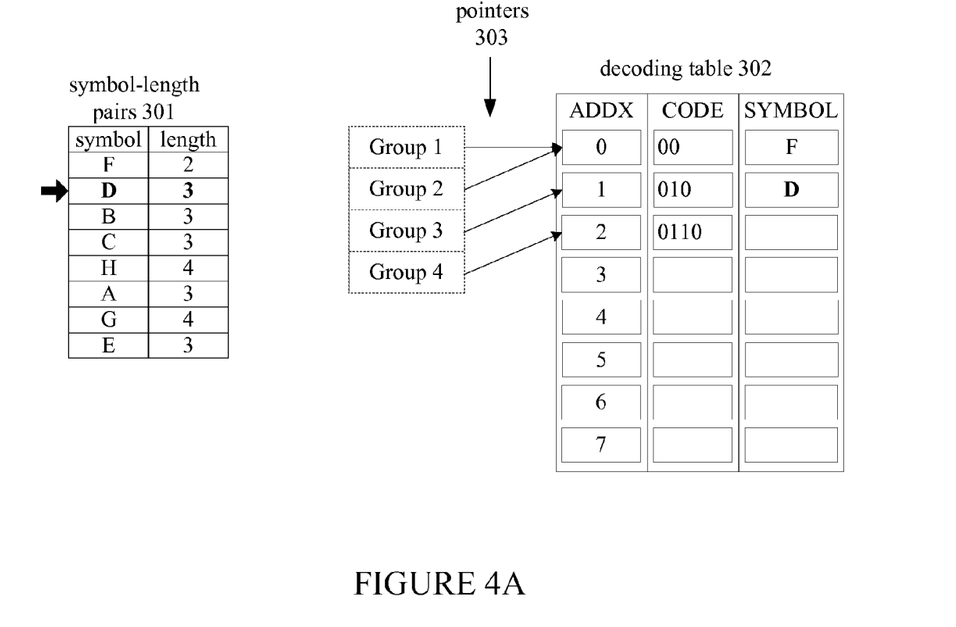

FIG. 4A illustrates the addition of the symbol 'D' to the table 302. In the table of symbol-length pairs 301, the symbol 'D' is associated with a bit length value of '3'; thus, Group 3 is selected as the target group into which 'D' will be inserted. Since Group 4 has a starting code that is equal to or greater than the starting code of the target Group 3, Group 4's pointer and starting code are incremented. The starting code for Group 4 is increased by $2^{(j-i)}$, or 2. Thus, Group 4's starting code changes from '0100' to '0110'. Group 4's pointer is incremented from '1' to '2'; thus the starting code '0110' for Group 4 is stored at the memory location corresponding to address 2. The symbol 'D' is stored at memory location '1', which is the next available memory location corresponding to Group 3. Symbol 'D' is the first symbol added to Group 3 and is thus associated with the starting code '010' of Group 3.

Figure 4B:
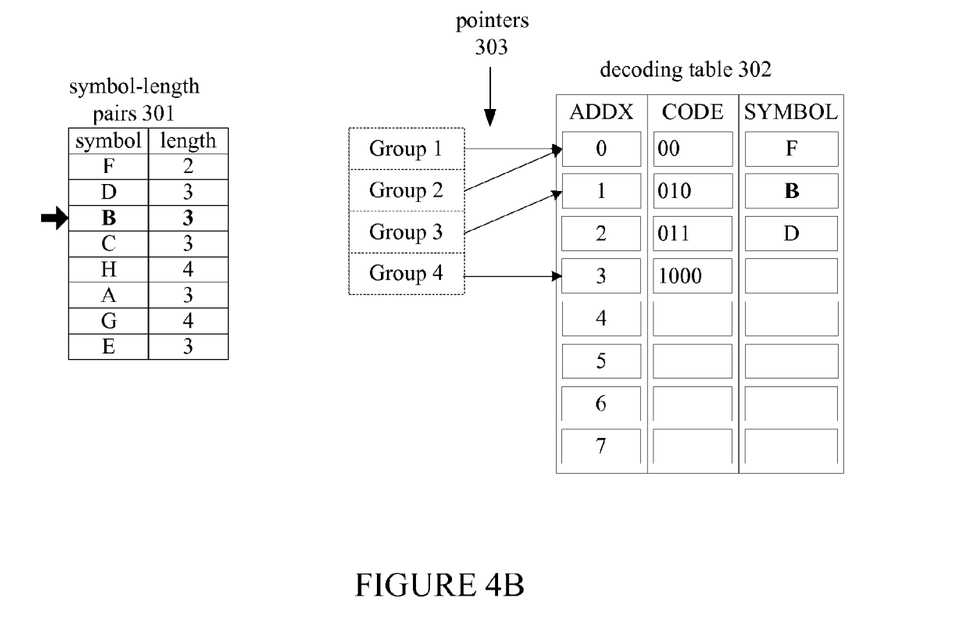

FIG. 4B illustrates the addition of the symbol 'B' to the table 302. Symbol 'B' is associated with a bit length value of '3'; thus, Group 3 is selected as the target group into which 'B' will be inserted. Since Group 4 has a starting code that is equal to or greater than the starting code of the target Group 3, Group 4's pointer and starting code are incremented. The starting code for Group 4 is increased by $2^{(j-i)}$, or 2. Thus, Group 4's starting code changes from '0110 to '1000'. Group 4's pointer is incremented from '2' to '3'; thus the starting code '1000' for Group 4 is stored at the memory location corresponding to address 3.

As provided at block 211 of process 200, symbols previously stored in the group that are subsequent to the new symbol in the predetermined lexical ordering may be shifted to a higher addressed memory location so that the lexical ordering may be preserved for symbols within the group. In one embodiment where alphabetical order is used as the predetermined lexical order, symbol 'D' would be shifted to a higher memory address so that 'B' could be stored in the same group while keeping both symbols in alphabetical order. In this case, 'D' may be shifted from address 1 to address 2, and 'B' may be stored at address 1. The next sequential code '011' may be added at memory address 2; thus, 'B' is associated with code '010' and 'D' is associated with '011'. The new symbol 'B' is therefore stored at a memory address 1 that maintains the lexical ordering of the symbols in Group 3.

In one embodiment, the symbol length pairs 301 may be pre-sorted according to the predefined lexical order before the symbols are added to the decoding table 302. Thus, the symbols would be added in lexical order and shifting of previously stored symbols within a target group may be avoided. Any new symbol being added would follow any previously added symbol in the lexical order; therefore, the new symbol could simply be added at the end of the target group and associated with a new sequential code.

Figure 5A:
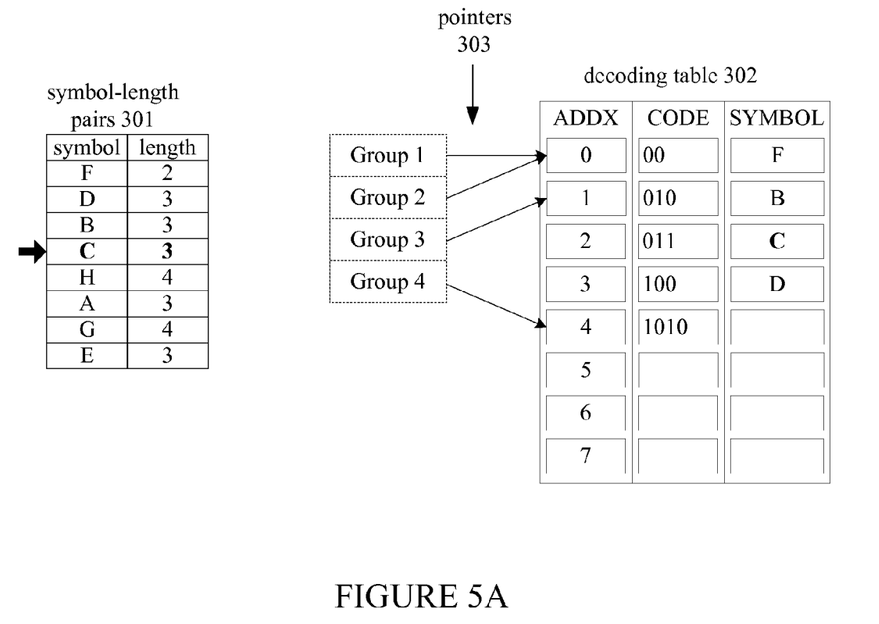

FIG. 5A illustrates the addition of the symbol 'C' to the table 302. Symbol 'C' is associated with a bit length value of '3'; thus, Group 3 is selected as the target group into which 'C' will be inserted. Since Group 4 has a starting code that is equal to or greater than the starting code of the target Group 3, Group 4's pointer and starting code are incremented. The starting code for Group 4 is increased by $2^{(j-i)}$, or 2. Thus, Group 4's starting code changes from '1000 to '1010'. Group 4's pointer is incremented from '3' to '4'; thus the starting code '1010' for Group 4 is stored at the memory location corresponding to address 4.

In one embodiment, 'C' occurs in the predetermined lexical order after 'B' and before 'D'; therefore, 'D' is shifted from its current address 2 to a higher memory address 3. The next sequential code '100' is stored at address 3, and 'C' is stored at address 2. Thus, the symbols 'B', 'C', and 'D' remain in lexical order, corresponding to codes '010', '011', and '100'.

Figure 5B:
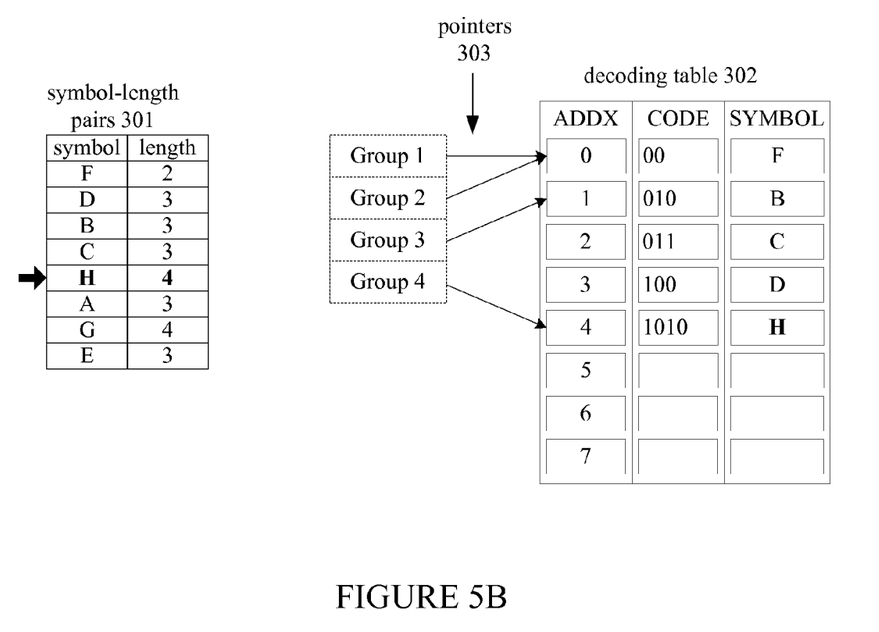

FIG. 5B illustrates the addition of the symbol 'H' to the table 302. Symbol 'H' is associated with a bit length value of '4'; thus, Group 4 is selected as the target group into which 'H' will be inserted. Since no other group has a starting code that is equal to or greater than the starting code of the target Group 4, no group pointers or starting codes need to be incremented. Symbol 'H' is stored at address 4, and as the first symbol to be stored in Group 4, is thus associated with the starting code '1010' for Group 4.

Figure 6A:
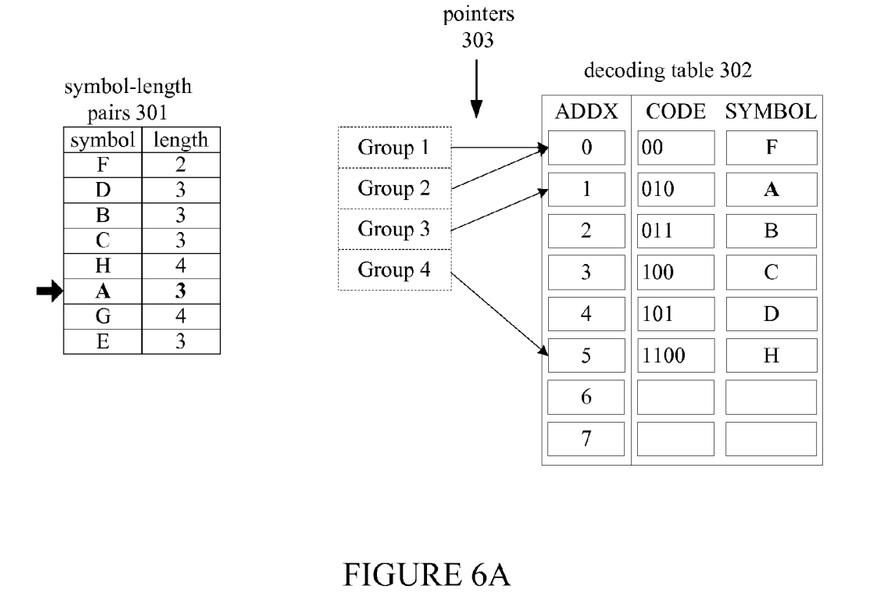

FIG. 6A illustrates the addition of the symbol 'A' to the table 302. Symbol 'A' is associated with a bit length value of '3'; thus, Group 3 is selected as the target group into which 'A' will be inserted. Since Group 4 has a starting code that is equal to or greater than the starting code of the target Group 3, Group 4's pointer and starting code are incremented. The starting code for Group 4 is increased by $2^{(j-i)}$, or 2. Thus, Group 4's starting code changes from '1010 to '1100'. Group 4's pointer is incremented from '4' to '5'; thus the starting code '1100' for Group 4 is stored at the memory location corresponding to address 5. Notably, the starting code '1100' for Group 4 is also the code associated with the previously added symbol 'H'.

In the predetermined lexical order, the symbol 'A' occurs prior to the symbols 'B', 'C', and 'D', which have previously been added to Group 2. Thus, 'B', 'C', and 'D' are each moved from their respective current addresses to the next higher addresses. The next sequential code '101' is added at address 4. The new symbol 'A' is stored at address 1. Thus, symbols 'A', 'B', 'C', and 'D' are stored in lexical order, and are associated with codes '011', '100', and '101', respectively.

Figure 6B:
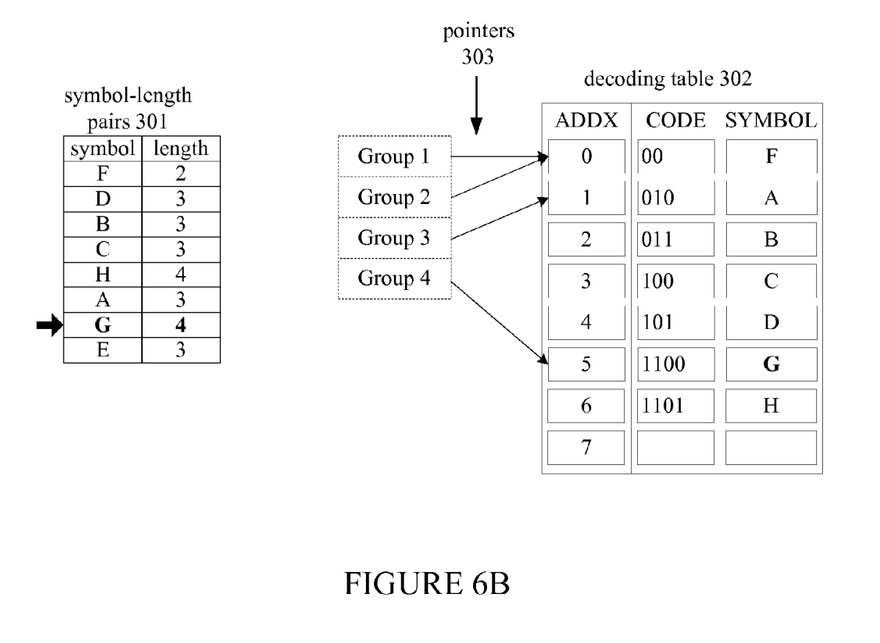

FIG. 6B illustrates the addition of the symbol 'G' to the table 302. Symbol 'G' is associated with a bit length value of '4'; thus, Group 4 is selected as the target group into which 'G' will be inserted. Since no other group has a starting code that is equal to or greater than the starting code of the target Group 4, no group pointers or starting codes need to be incremented.

The new symbol 'G' precedes 'H' in the predetermined lexical order; thus, symbol 'H' is shifted up from address 5 to the next higher memory address 6. The next sequential code '1101' is stored at address 6 such that 'H' is now associated with the new code '1101'. Symbol 'G' is stored at address 5 to be associated with code '1100'.

Figure 7A:
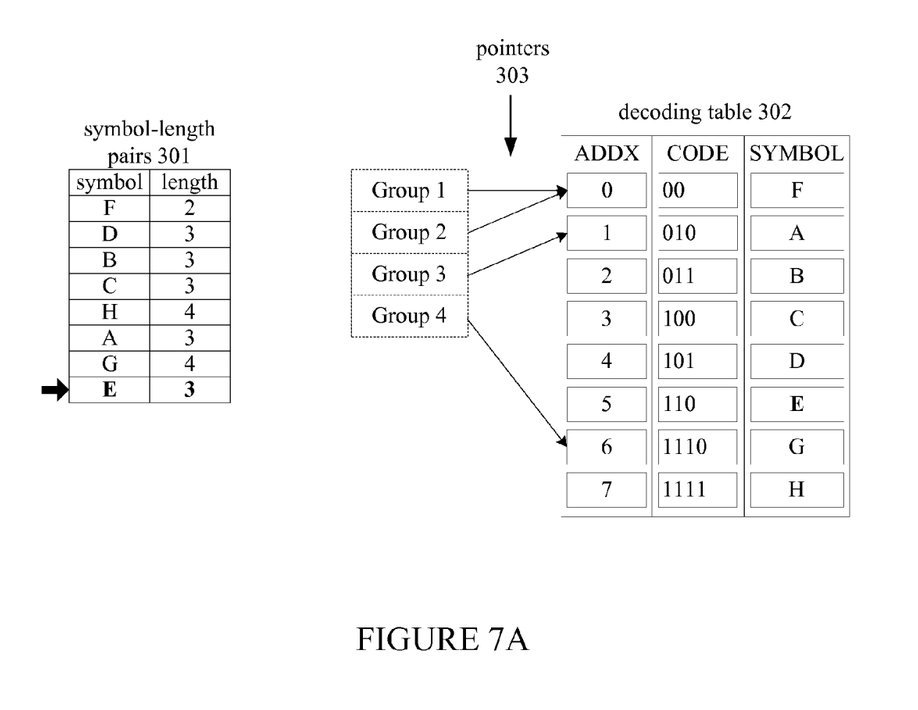

FIG. 7A illustrates the addition of the symbol 'E' to the table 302. Symbol 'E' is associated with a bit length value of '3'; thus, Group 3 is selected as the target group into which 'E' will be inserted. Since Group 4 has a starting code that is equal to or greater than the starting code of the target Group 3, Group 4's pointer and starting code are incremented. The starting code for Group 4 is increased by $2^{(j-i)}$, or 2. Thus, Group 4's starting code changes from '1100' to '1110'. Group 4's pointer is incremented from '5' to '6'; thus the new starting code '1110' for Group 4 is stored at the memory location corresponding to address 6. Thus, symbol 'G' is associated with code '1110'.

In one embodiment, other codes in higher groups aside from the starting code may also be incremented in a similar manner. In the example as illustrated in FIG. 7A, code '1101' corresponding to symbol 'H' may also be incremented by adding $2^{(j-i)}$, or 2, resulting in a new code '1111'.

The final decoding table 302 is illustrated in FIG. 7A, and includes the symbol-code pairs (F, '00'), (A, '010'), (B, '011'), (C, '100'), (D, '101'), (E, '110'), (G, '1110'), and (H, '1111'). In one embodiment, the symbols in the finished table 302 are grouped according to their associated bit lengths, where the symbols having the shortest bit length values are at the beginning of the table 302 and the symbols having the longest bit length values are at the end. In one embodiment, symbols with equal length encodings are grouped together, and may be stored in adjacent memory locations. In one embodiment, the pointers 303 may be stored in a separate pointer table or other data structure, and may indicate the starting locations of each of the groups and/or starting codes for each of the groups.

Figure 7B:
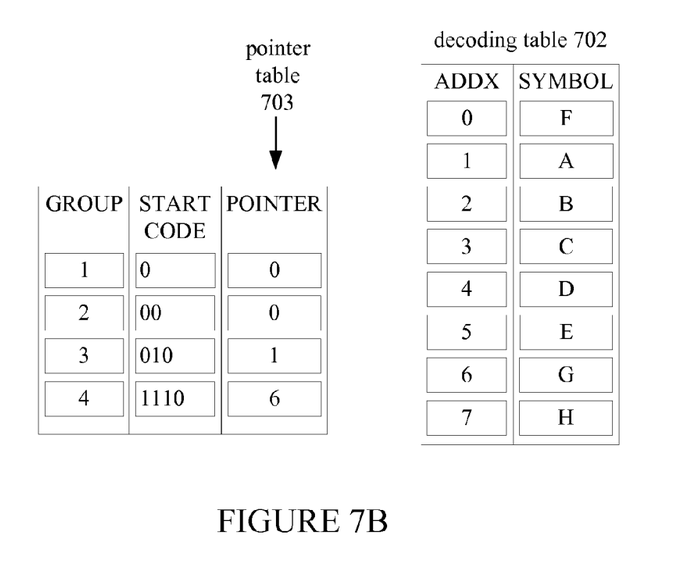
FIG. 7B illustrates a pointer table and a decoding table, according to one embodiment.

FIG. 7B illustrates an embodiment of a decoding table 702 and pointer table 703, according to one embodiment. Pointer table 703 associates each of the Groups 1-4 with a start code and a pointer value. The start code and pointer values in table 703 may be updated by a process similar to that previously described with reference to FIGS. 3A-7A.

Decoding table 702 stores the symbols A-H; however, table 702 may not necessarily store the explicit codes associated with each of the symbols A-H. Instead, the associated codes for symbols A-H are inherent from the locations at which the symbols are stored and the values of the start codes and pointers in table 703. By this arrangement, the calculation and manipulation of the codes for each symbol during the addition of symbols to the table 702 may be avoided.

In one embodiment, the completed decoding table 302 or 702, as illustrated in FIG. 7A or 7B, may be used to decode an incoming stream of encoded data bits into the original symbols from which the encoded data was generated. In one embodiment, the M leading bits of the encoded data may be compared against the starting codes of the groups to identify a group in which the next decoded symbol will be found, where M is the number of bits in the starting code being compared. In one embodiment, this comparison process may correspond to block 223 of process 200. For example, where the leading bits of the encoded data are '01111011000 . . . ', the first two bits '01' of the encoded data may be compared with the starting code '00' of Groups 1 and 2. Since the bits '01' of the encoded data are greater than the starting code of Groups 1 and 2, the first three bits '011' of the encoded data may be compared with the starting code '010' of Group 3. Since '0111' of the encoded data is not greater than the starting code '1110' for the next highest Group 4, it can be determined that the symbol being decoded is represented by one of the 3-bit codes found in Group 3.

In one embodiment, the encoded bits may be compared with the highest starting code to the lower starting codes in sequence until a starting code lower than the encoded bits is found. Alternatively, the encoded bits may be compared with lower starting codes first, since the encoded symbol is more likely to be found in the lower numbered groups, according to a scheme wherein more frequently occurring symbols are associated with shorter bit codes.

In one embodiment, the starting code of the identified group containing the symbol being decoded may be subtracted from the M bits of the encoded data. Continuing the previous example, the starting code '010' of Group 3 may be subtracted from the encoded bits '011', resulting in an offset value of '001'. This offset value may be added to the address indicated by the group's pointer to locate the decoded symbol in memory. Thus, the offset value '001' may be added to the Group 3 pointer value of '1', resulting in an address of '2'. The decoded symbol 'B' may then be retrieved from memory location 2 and sent to an output data stream or file.

The leading bits '011', having been decoded, may be removed from the incoming stream of encoded data, leaving the bits '11011000 . . . ' to be decoded in similar fashion. The next set of M bits, '110', would then identify Group 3 by comparison with the group starting codes. The offset value would be calculated as '010' subtracted from '110', which results in a value of '100', or 4. The decoded symbol 'E' may then be retrieved from memory location 5, calculated by adding 4 to the Group 3 pointer value of 1.

Figure 8:
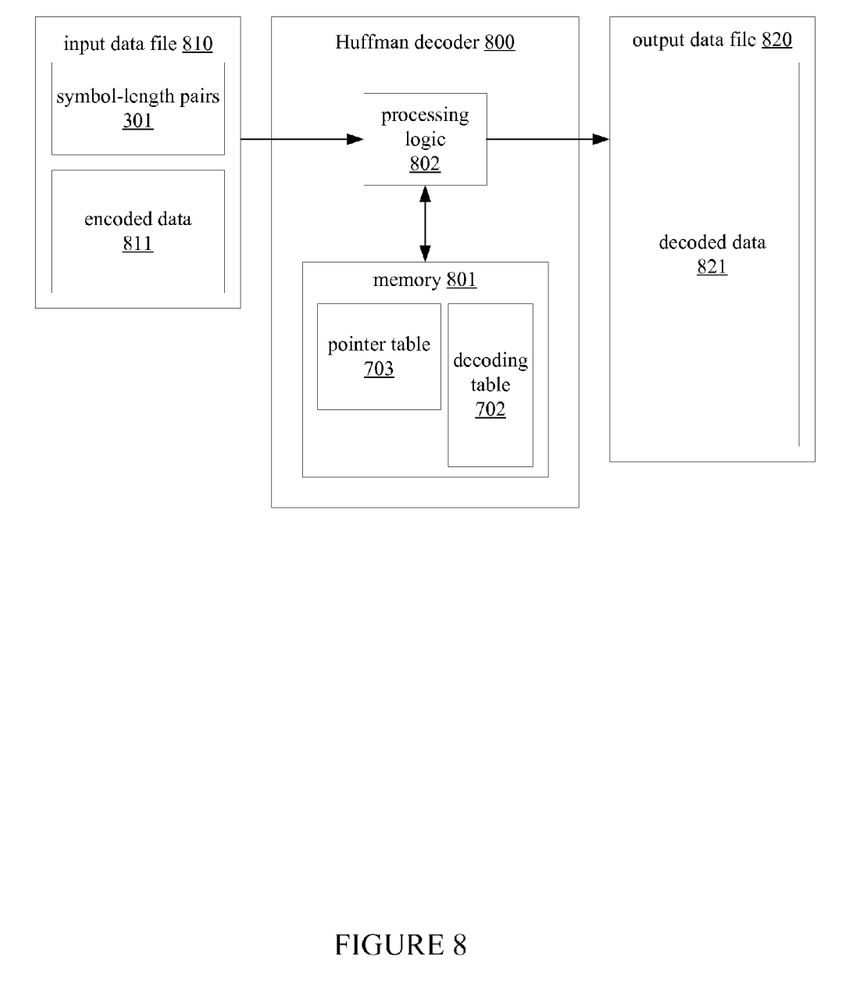
FIG. 8 illustrates a Huffman decoder apparatus, according to one embodiment.

FIG. 8 illustrates a Huffman decoder 800 that may be used to perform process 200 to decode encoded data 811 into decoded data 821, according to one embodiment. As illustrated in FIG. 8, the encoded data 811 may be contained in an input data file 810. In one embodiment, the input data file 810 may also contain a set of symbol-length pairs 301 in addition to the encoded data 811.

The symbol-length pairs 301 may be transmitted to the input of the Huffman decoder 800 and used by the decoder 800 to reconstruct a decoding table 702 and a pointer table 703. In one embodiment, the processing logic 802 of the decoder 800 may generate the decoding table 702 and pointer table 703 by performing operations similar to those illustrated in FIG. 2 at blocks 201-220. The decoding table 702 and pointer table 703 may be stored in a memory 801 coupled with the processing logic 802.

In one embodiment, the processing logic 802 may decode the encoded data 811 using the decoding table 702 and the pointer table 703 by performing operations similar to those illustrated at blocks 221-229, as illustrated in FIG. 2. The decoded output data 821 may be transmitted via an output of the Huffman decoder 800 to be stored in an output data file 820.

The embodiments described herein may include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the Huffman decoder 800 and/or portions thereof carried on the computer-readable storage medium may be a database or other data structure which can be read by a program and used, directly or indirectly, to fabricate the hardware comprising the Huffman decoder 800. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the Huffman decoder 800. The netlist may then be placed and routed to produce a data set describing geometric shapes to be applied to masks. The masks may then be used in various semiconductor fabrication steps to produce a semiconductor circuit or circuits corresponding to the Huffman decoder 800. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader spirit and scope of the embodiments as set forth in the appended claims. The specification and drawings are, accordingly, to be regarded in an illustrative sense rather than a restrictive sense.

What is claimed is:

1. A method of decoding Huffman-encoded data, comprising:
   receiving a symbol associated with the Huffman encoded data;
   selecting from a plurality of groups a target group for the symbol based on a bit length value associated with the symbol, wherein each of the plurality of groups is associated with a different bit length than any other group of the plurality of groups;
   associating the symbol with the target group;
   associating the symbol with a code, wherein the code comprises a number of bits indicated by the bit length value associated with the symbol; and
   incrementing a starting code for each of the plurality of groups associated with a starting code that is equal to or greater than a starting code of the target group.

2. The method of claim 1, further comprising:
   initializing each of a plurality of group pointers to indicate one same initial memory address, wherein each of the plurality of group pointers is associated with a different one of the plurality of groups; and
   in response to selecting the target group, incrementing the group pointer of each of the plurality of groups associated with a starting code equal to or greater than the starting code of the target group.

3. The method of claim 1, wherein associating the symbol with the target group comprises storing the symbol in a memory space corresponding to the target group.

4. The method of claim 3, wherein storing the symbol in the memory space corresponding to the target group further comprises storing the symbol at a memory location identified based on a predetermined lexical order of the symbol among previously stored symbols in the memory space.

5. The method of claim 3, wherein storing the symbol in the memory space corresponding to the target group comprises:
   for each previously stored symbol in the memory space that is subsequent to the symbol in a predetermined lexical order, shifting the previously stored symbol to a higher-addressed memory location; and
   storing the symbol in a memory location corresponding to a position of the symbol in the predetermined lexical order.

6. The method of claim 1, wherein associating the symbol with the code further comprises storing the symbol at a memory location associated with the code.

7. The method of claim 1, wherein for each group of the plurality of groups associated with a starting code that is equal to or greater than the starting code of the target group, incrementing the starting code of the group comprises adding $2^{(j-i)}$ to the starting code, wherein i represents the bit length value of the symbol and j represents a bit length value associated with the group.

8. The method of claim 1, further comprising generating decoded data from the Huffman-encoded data based on the symbol and the code associated with the symbol.

9. The method of claim 8, wherein generating the decoded data further comprises:
   receiving a sequence of encoded bits of the Huffman-encoded data;
   identifying a group associated with the sequence of encoded bits by comparing the sequence of encoded bits with the starting code for at least one of the plurality of groups;
   calculating a memory offset by subtracting the sequence of encoded bits from the starting code of the identified group; and
   retrieving the symbol from a memory location identified by the offset.

10. A method, comprising:
    receiving a plurality of symbol-length pairs each comprising a symbol associated with a bit length value;
    for each symbol-length pair of the plurality of symbol-length pairs,
      selecting, based on the bit length value of the symbol-length pair, a target group from a plurality of groups each associated with different bit length values,
      associating the symbol of the symbol-length pair with the target group,
      associating the symbol with one of a plurality of codes, wherein each of the plurality of codes comprises a number of bits indicated by the bit length value of the symbol-length pair, and
      incrementing a starting code for each of the plurality of groups associated with a starting code that is equal to or greater than the starting code of the target group; and
    generating decoded data from encoded data and based on the plurality of symbols and the plurality of codes.

11. The method of claim 10, further comprising:
    initializing each of a plurality of group pointers to indicate one same initial memory address, wherein each of the plurality of group pointers is associated with a different one of the plurality of groups; and
    in response to selecting the target group, incrementing the group pointer of each of the plurality of groups associated with a starting code equal to or greater than the starting code of the target group.

12. The method of claim 10, wherein associating the symbol with the target group comprises storing the symbol in a memory space associated with the target group, and wherein associating the symbol with the code comprises storing the symbol at a memory location associated with the code.

13. The method of claim 12, wherein storing the symbol in the memory space corresponding to the target group comprises:
    for each previously stored symbol in the memory space that is subsequent to the symbol in a predetermined lexical order, shifting the previously stored symbol to a higher-addressed memory location; and
    storing the symbol in a memory location corresponding to a position of the symbol in the predetermined lexical order.

14. The method of claim 10, wherein for each group of the plurality of groups, incrementing the starting code of the group comprises adding $2^{(j-i)}$ to the starting code, wherein i represents the bit length value of the symbol and j represents a bit length value associated with the group.

15. The method of claim 10, wherein the encoded data comprises Huffman encoded data.

16. The method of claim 10, wherein generating the decoded data further comprises:
    receiving a sequence of encoded bits of the encoded data;

identifying a group associated with the sequence of encoded bits by comparing the sequence of encoded bits with the starting code for at least one of the plurality of groups;

calculating a memory offset by subtracting the sequence of encoded bits from the starting code of the identified group; and retrieving a decoded symbol from a memory location identified by the offset.

17. A non-transitory computer-readable medium storing instructions that when executed by a processor cause the processor to perform a method comprising:

receiving a symbol associated with Huffman encoded data;

selecting from a plurality of groups a target group for the symbol based on a bit length value associated with the symbol, wherein each of the plurality of groups is associated with a different bit length than any other group of the plurality of groups;

associating the symbol with the target group;

associating the symbol with a code, wherein the code comprises a number of bits indicated by the bit length value associated with the symbol; and incrementing a starting code for each of the plurality of groups associated with a starting code that is equal to or greater than the starting code of the target group.

18. The non-transitory computer-readable medium of claim 17, wherein the method further comprises generating decoded data from encoded data and based on the symbol and the code associated with the symbol.

19. The non-transitory computer-readable medium of claim 18, wherein generating the decoded data further comprises:

receiving a sequence of encoded bits of the encoded data;

identifying a group associated with the sequence of encoded bits by comparing the sequence of encoded bits with the starting code for at least one of the plurality of groups;

calculating a memory offset by subtracting the sequence of encoded bits from the starting code of the identified group; and retrieving a decoded symbol from a memory location identified by the offset.

20. The non-transitory computer-readable medium of claim 17, wherein associating the code with the symbol comprises storing the code at a memory location associated with the symbol, and wherein associating the symbol with the target group comprises:

for each previously stored symbol in the memory space that is subsequent to the symbol in a predetermined lexical order, shifting the previously stored symbol to a higher-addressed memory location; and storing the symbol in a memory space associated with the target group, at a memory location corresponding to a position of the symbol in the predetermined lexical order.

* * * * *